United States Patent [19]

Beech

[11] Patent Number: 4,631,487
[45] Date of Patent: Dec. 23, 1986

[54] PHASE LOCK LOOP TELEVISION SIGNAL DEMODULATOR

[75] Inventor: Brian H. Beech, Bishopstoke, England

[73] Assignee: Independent Broadcasting Authority, London, England

[21] Appl. No.: 779,571

[22] Filed: Sep. 24, 1985

[51] Int. Cl.$^4$ ............................ H03D 3/24; H04N 9/66
[52] U.S. Cl. ...................................... 329/50; 329/122; 358/23; 455/260; 455/312
[58] Field of Search ................. 329/50, 122; 455/260, 455/263, 265, 312; 358/23, 24, 25

[56] References Cited

U.S. PATENT DOCUMENTS 3,626,301  12/1971  Develet, Jr. ................... 329/50 X

FOREIGN PATENT DOCUMENTS

WO85/03615  8/1985  Int'l Pat. Institute ............. 329/122

OTHER PUBLICATIONS

Garden et al., "A Multifilter Phase-Lock Loop", IEEE Transactions on Communication Technology, vol. COM-19, No. 5, Oct. 1971, pp. 669-675.

Primary Examiner—Siegfried H. Grimm

[57] ABSTRACT

A phase lock loop demodulator has its loop amplifier and filter designed such that the transfer function of the amplifier and filter is optimized for the presence of sound and color subcarriers. An equalizer circuit is included in the demodulator for equalizing the demodulator response and has a transfer function which is independent of the transfer function of the loop filter and amplifier whereby to render the demodulator insensitive to small frequency errors around the subcarrier frequencies.

5 Claims, 6 Drawing Figures

PHASE LOCK LOOP TELEVISION SIGNAL DEMODULATOR

The present invention relates to the threshold extension of phase lock loop (PLL) demodulators.

Threshold optimisation of PLL demodulators used for television signals can be achieved by shaping the error response of the loop so that it is approximately proportional to the inverse of the spectrum of modulating signal. This technique is the subject of our application PCT/GB No. 85/00052 (WO No. 85/03615) and also of Independent Broadcasting Authority Experimental and Development Report 130/84 issued July 1985. The shaping of the error response necessarily results in a forward loop response which is not flat over the frequency band of the signal and normally an equaliser is used to equalise the response of the demodulator. It has been found that the design of the equaliser is important.

The present invention provides a phase lock loop demodulator having a loop amplifier and filter whose transfer function (F(S)) is optimised for the presence of sound and colour subcarriers and in which an equaliser is provided for equalising the response of the demodulator, the equaliser having a transfer function which is independent of the transfer function of the loop filter.

The advantage of this arrangement is that the demodulator is less sensitive to small frequency errors around the subcarrier frequencies.

In order that the present invention be more readily understood embodiments thereof will now be described by way of example only with reference to the accompanying drawings, in which.

Figure 1:
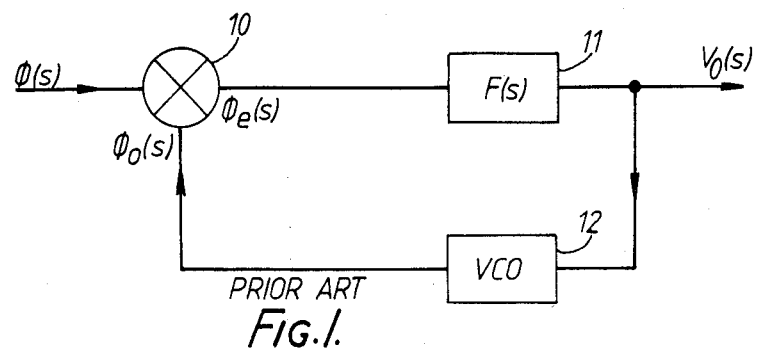
FIG. 1 is a block diagram of a basic form of phase lock loop demodulator.

Referring firstly to FIG. 1, this block diagram shows the basic form of a PLL demodulator comprising a phase detector 10 whose output is fed to a loop filter circuit 11. The output from the filter circuit 11 constitutes the output of the demodulator and is also fed back through a voltage controlled oscillator 12 to the phase detector 10 where the input signal $\phi(S)$ is compared with the fed back signal $\phi_o(S)$ from the oscillator 12 to derive an error signal $\phi_e(S)$ which is fed to the filter circuit 11.

Figure 2:
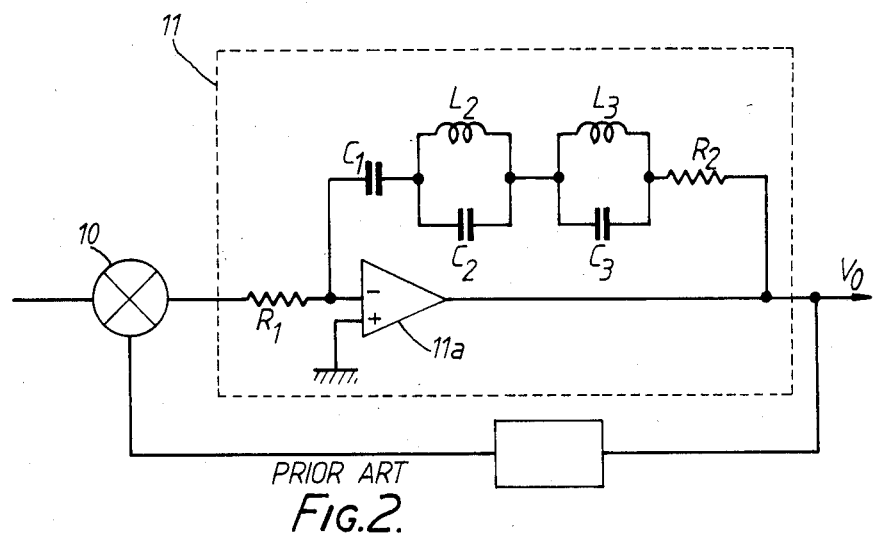
FIG. 2 is a more detailed configuration of the demodulator shown in FIG. 1.

FIG. 2 shows how the circuit of FIG. 1 may be optimised for PAL. Those skilled in the art will appreciate that optimisation for other subcarrier based signals such as NTSC and SECAM is also possible. The filter circuit 11 is shown as comprising an operational amplifier 11a whose non-inverting terminal is earthed and whose inverting terminal is connected to its output through an optimisation loop comprising a capacitor $C_1$, two tuned circuits and a resistance $R_2$. The tuned circuits are respectively tuned to the frequencies of the sound and chroma subcarriers. The sound subcarrier tuned circuit comprises inductance $L_2$ in parallel with capacitance $C_2$ and the chroma subcarrier tuned circuit comprises inductance $L_3$ in parallel with capacitance $C_3$.

The capacitor $C_1$ provides high loop gain at low vision frequencies and the two tuned circuits provide the necessary shaping to allow for the presence of the sound and colour subcarriers.

Figure 3:
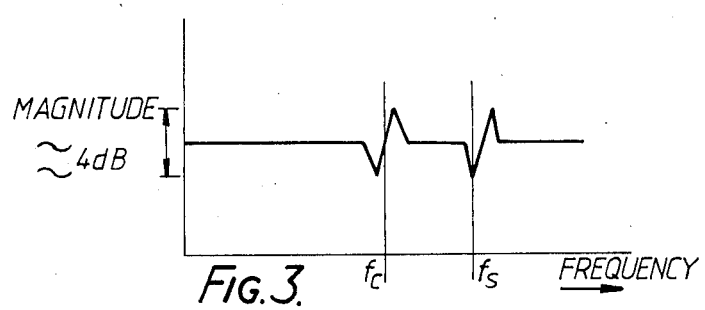
FIG. 3 shows the frequency response obtained from the demodulator shown in FIG. 2.

The frequency response obtained from the demodulator is shown in FIG. 3.

Under typical operating conditions as a television demodulator, an amplitude ripple of approximately 3–4 dB peak to peak is obtained. If the loop bandwidth is increased, then the ripple will reduce but the threshold improvement due to the shaping network will also reduce. What is required is a means for equalising the response.

If the transfer function of the loop filter circuit is assumed to be F(S) then the loop forward transfer can be written as $$\frac{\phi_o(S)}{\phi(S)} = \frac{KoKdF(S)}{S + KoKdF(S)}$$

where
Ko=Oscillator sensitivity (rad/S/V)
Kd=Phase detector sensitivity (V/rad)
$\phi_o(S)$=oscillator output phase (rad)
$\phi(S)$=input signal phase (rad)

An equaliser for the loop forward transfer would thus have a transfer function of $$1 + \frac{S}{F(S)KoKd}$$

which is dependent on F(S) and on KoKd.

The above transfer function for the equaliser can be implemented using two resonant elements which match accurately (both in terms of centre frequency and Q factor) the elements in the loop itself. However, we have found that since the forward tranfer function changes rapidly with frequency around the subcarriers, only a small frequency error in the equaliser can result in a significant overall error.

The present invention therefore is directed to the provision of an equaliser for the above forward loop transfer and which is less sensitive to frequency errors.

Figure 4:
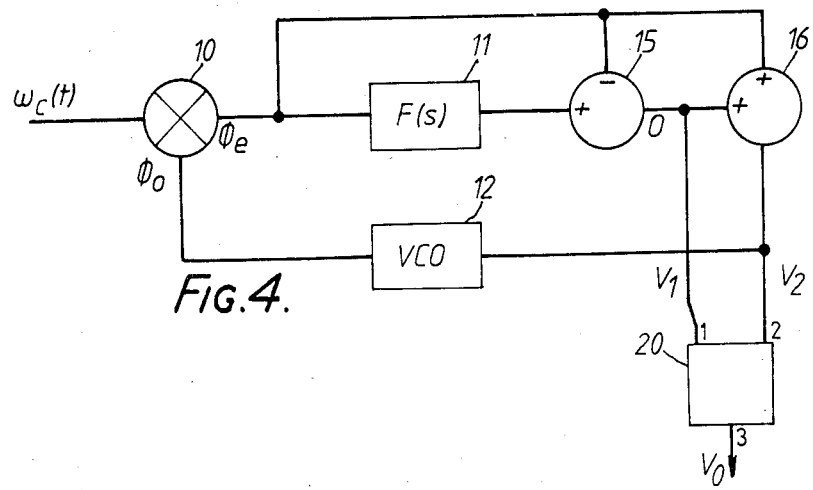
FIG. 4 shows a block diagram of the circuit shown in FIG. 1 modified to accommodate a 3 port equaliser.

Attention is now directed to FIG. 4 which shows a block diagram of a PLL which has been configured to accommodate a 3-port equaliser 20. The output of the loop filter circuit 11 is fed to one input of a first adder 15 while the input to the filter circuit 11 is connected to another input to the adder 15. The output from the adder 15 is the difference between the two inputs and is identified as V1 and is fed to port ① of the 3-port equaliser 20. The output of the adder 15 is also fed as an input to a further adder 16 whose other input is connected to the input of the filter circuit 11. The output of the adder 16 is connected to the input of the oscillator 12 and is fed to port ② of the 3-port equaliser 20 as an input signal V2. The output Vo of the demodulator is taken from port ③ of the equaliser 20.

If $W_c$ is the instantaneous angular input frequency in radians/sec then the signal appearing at port ② of the equaliser 20 in response to the input signal is given by $$\frac{V_2}{W_c}(S) = \frac{KdF(S)}{S + KoKdF(S)}$$

This is the same as would be obtained from the output of an unequalised loop.

The signal appearing at port ① in response to the input signal is given by:

$$\frac{V_1}{W_C} = \frac{Kd(F(S) - 1)}{S + KoKdF(S)}$$

so let the transmission from port (2) to (3)=1 let the transmission from port (1) to (3)= $-S/S+KoKd$
Then $$\frac{V_o}{W_c} = \frac{Kd\,F(S)}{S + KoKd\,F(S)} - \frac{S}{S + KoKd}\left(\frac{Kd\,(F(S) - 1)}{S + KoKd\,F(S)}\right)$$

$$= \frac{Kd\,F(S)\,(S + KoKd) - S\,Kd\,(F(S) - 1)}{(S + KoKd\,F(S))\,(S + KoKd)}$$

$$= \frac{Kd}{S + KoKd} = \frac{1}{Ko}\left(\frac{1}{1 + \frac{S}{KoKd}}\right)$$

This is exactly the response which would be obtained from the basic loop with no shaping function F(S).

We therefore have a means of optimising threshold by selecting F(S) *without affecting the forward/response of the loop*. The equalisation is in theory totally accurate for any F(S) which is consistent with a stable loop. It can be seen that the required transfer function of the equaliser from (1) to (3) is:

$$\frac{-S}{S + KoKd}$$

This is dependent on the magnitude of the loop gain, KoKd, of the loop.

Figure 5:
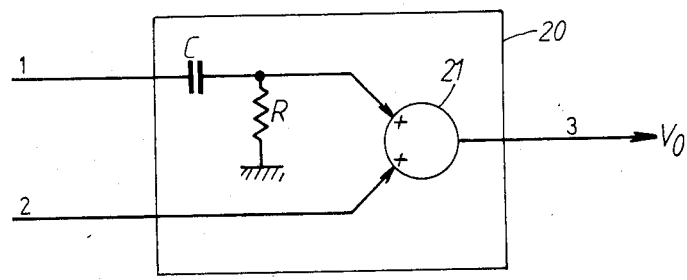
FIG. 5 shows in general terms how to implement a 3 port equaliser.

FIG. 5 shows diagrammatically how to implement the equaliser functions from port ② to port ③ and port ① to port ③. It will be seen that port ② is connected through an adder 21 to the port ③ while port ① is connected via a combination of a capacitance C and resistance R to another input of the adder 21.

The values of C and R are chosen such that $$CR = \frac{1}{KoKd}$$

Figure 6:
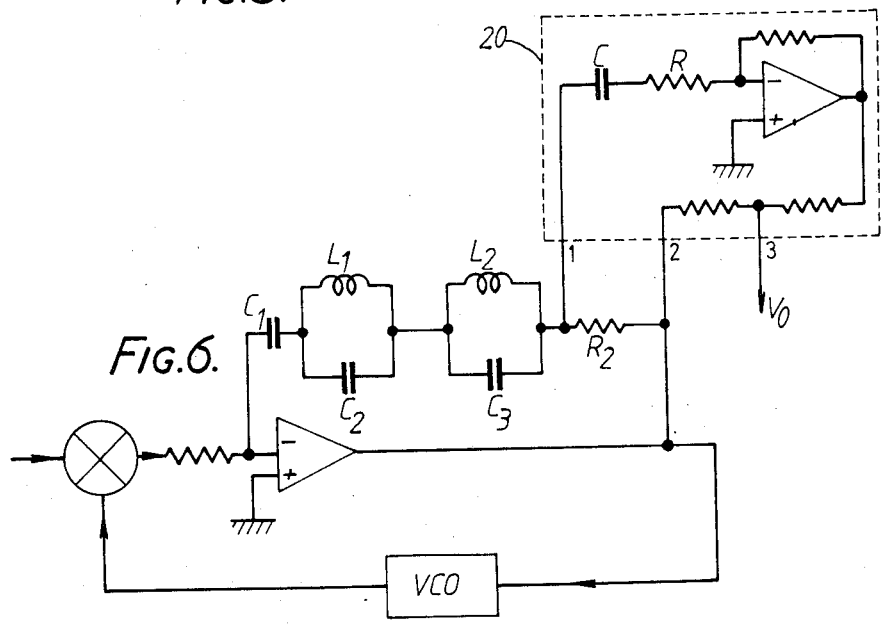
FIG. 6 shows partly in block diagram terms and partly as a circuit design how to implement the demodulator of FIG. 2 with a 3 port equaliser.

FIG. 6 shows FIG. 2 modified to include one form of a 3-port equaliser. The equaliser 20 is based on an operational amplifier whose non-inverting input is earthed and whose inverting input is connected to the junction between the chroma tuned circuit and the resistance $R_2$ in the loop filter circuit 11 via series connected capacitance C and resistance R. The output from the equaliser (port ③) is taken from the junction between two resistors connected between the output from the amplifier and port ② which port is connected to the output of the loop filter circuit 11.

The overall configurations uses a combination of bandpass filters and a low pass filter and has a wideband dc path.

I claim:

1. A phase lock loop demodulator including a loop amplifier and filter and an equaliser circuit, wherein the amplifier and filter has its transfer function optimised for the presence of sound and colour subcarriers, and wherein the equaliser circuit has a transfer function which is independent of the transfer function of the loop amplifier and filter.

2. A demodulator according to claim 1, wherein the equaliser circuit comprises a 3-port filter network with two input ports and one output port.

3. A demodulator according to claim 2, wherein the transmission from one input port to the output port is equal to unity and the transmission from the other input port to the output port is $$\frac{-S}{S + KoKd}$$

where
Ko=voltage controlled oscillator sensitivity
Kd=phase detector sensitivity.

4. A demodulator according to claim 3, wherein the transmission between said other input port and said output port is achieved through a CR filter.

5. A demodulator according to claim 4, wherein the equaliser circuit comprises an operational amplifier whose non-inverting input is earthed and whose inverting input is connected to said other input port by a series connected resistance and capacitance, the output port being constituted by a tapping on a resistor connected between the output of the operational amplifier and said one input port.

* * * * *